PIEZOELECTRIC-SEMICONDUCTOR, ELECTROMECHANICAL TRANSDUCER

Filed Aug. 6, 1965

INVENTOR.
RICHARD S. MULLER
JAMES CONRAGAN

Townsend & Townsend
ATTORNEYS

United States Patent Office 3,351,786

Patented Nov. 7, 1967

3,351,786

PIEZOELECTRIC-SEMICONDUCTOR, ELECTROMECHANICAL TRANSDUCER

Richard S. Muller, Berkeley, and James Conragan, Albany, Calif., assignors to The Regents of the University of California, Berkeley, Calif.

Filed Aug. 6, 1965, Ser. No. 477,689

7 Claims. (Cl. 310—8)

This invention relates to a novel semiconductor device and method of application which is sensitive to stress and strain to provide an output signal which is an analogue of the stress or strain applied.

The principle and object of this invention is to provide a semiconductor transistor combination having the main body of the transistor formed of piezoelectric material in which power gain is affected in accordance with the stress or strain applied to the piezoelectric body. The effect will be approximately linear for small applied stresses or strains.

In the present invention an insulated-gate, field-effect transistor is formed on a piezoelectric material having a source and drain electrode mounted on opposite ends of the piezoelectric body with an insulated conductive gate located above the channel between the source and drain in such way that when the piezoelectric body is mechanically stressed or strained there will be a change in charge density at the surface of the piezoelectric body which will change the output current of the device to provide an output which is an analogue of the quantum of stress or strain applied.

A feature and advantage of this invention lies in the fact that the reaction time of the device is extremely fast in the order of fractions of a microsecond and at the same time the device exhibits a constant D.C. output for so long a period as the stress or strain is applied.

A further feature and advantage of this invention is in the adaptation of the device for use as either a static or dynamic transducer for conversion of stress or strain into electric values.

Another object of this invention is to provide a combination employing an electromechanical transducer which is formed of a metal, insulator, piezoelectric-semiconductor transistor formed of extremely thin films to form the component elements of a transistor in such a way as to allow the device to be manufactured by commonly known vacuum deposition techniques.

A further object of the invention is to provide a combination including piezoelectric mechanical transducer in which the device functions to provide a power gain by the combined use of piezoelectric and transistor effects within the device.

A feature and advantage of subject combination lies in the adaptability of the combination for use in combined functions of electrical and mechanical modulation of input to effect an electromechanical mixing function.

Other objects, features, and advantages of the present invention will be more apparent after referring to the following specification and attached drawings in which.

Figure 3:
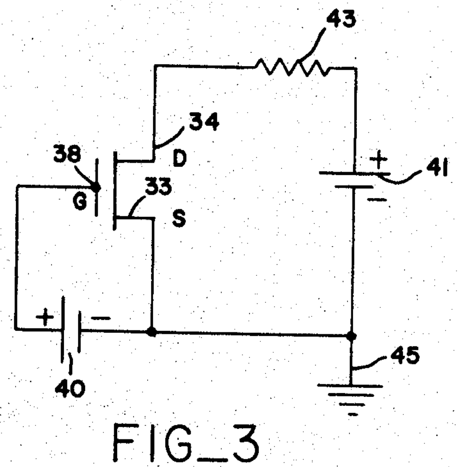
FIG. 3 is a schematic view of a circuit for applying the subject invention for use in stress and strain measurements.

In the device of the present invention the principal embodiment is formed to provide an electromechanical transducer A having a base 15 formed of cadmium sulfide (CdS) although other piezoelectric semiconducting material can also be used. At opposite ends of body 15 are formed two aluminum terminals forming a source 18 and a drain 19, although any electrode which provides ohmic connection to the channel may be used. An insulator 20, formed of silicon oxide, although other insulating materials may be used, is arranged to cover both source and drain 19 and the top face 21 of the cadmium sulfide base 15. An aluminum gate 25 is attached on the top of insulator 20 overlaying the channel region between the source and the drain. Any conducting material may be used for the gate.

Figure 1:
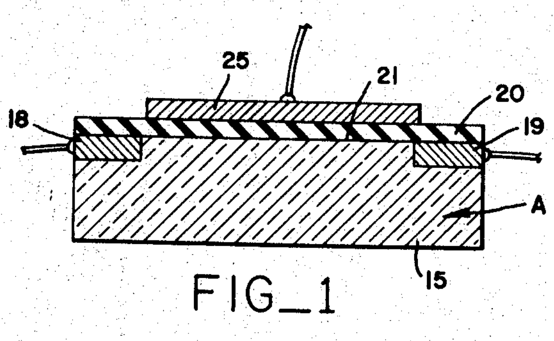
FIG. 1 is a cross-sectional view of an embodiment of the transducer of the subject invention.
Figure 2:
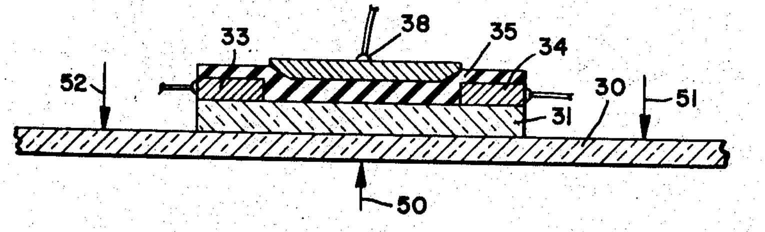
FIG. 2 is an alternate thereof.

The representation shown in FIG. 1 is grossly exaggerated for the purpose of clarity to show the relationship of the various components of the device and is not intended to illustrate scale. FIGURES 1 and 2 represent a single-crystal of a piezoelectric semiconductor on which the insulated-gate field-effect transistor has been formed. In FIG. 1, the piezoelectric material is self-supporting; in FIG. 2 an underlying support is provided. The element may also be formed of extremely thin films which may be best fabricated by evaporation techniques or a vapor-growth process wherein each of the elements can be formed of extremely thin films in the order of submicron thicknesses.

The embodiment shown in FIG. 2 may also represent a generaly identical device to that shown and described in connection with FIG. 1, but in which the device is mounted on a glass slide 30 upon which the base material 31 is deposited. Over the base film 31 are the sources and drains 33 and 34. Over the source and drain is the insulator 35 and deposited over the insulator is the gate 38.

One typical model for the device shown in FIG. 2 has been constructed using Pyrex microscopic slides or, alternatively, Corning 7059 glass slides for use as a supporting of substrate material to form support slide 30.

The slide 30 was heated to roughly 180° centigrade during deposition of the cadmium sulfide base which was accomplished at $10^{-5}$ torr. The cadmium sulfide used was of ultrahigh purity grade and was deposited from a source which was at a temperature of 760° centigrade and at a rate 1000 A./minute The resulting films were shown by X-ray diffraction studies as being polycrystalline cadmium sulfide having the wurtzite lattice with over 90% of the crystals having their C-axis normal to the substrate or slide 30. The crystallites were submicron in size. The source and drain were formed by deposited aluminum evaporated from a multi-strand tungsten filament after which the silicon oxide coating was applied. The final step in the fabrication of the device included the deposition of gate electrodes 25, also formed of deposited aluminum, being evaporated from multi-strand tungsten filament, whereafter, terminals were applied to the gate source and drain in the conventional manner to form gate 38, source 33, and drain 34.

The circuit application for the devices which are shown in FIGS. 1 and 2 and described for convenience with reference to the referenced numerals of FIG. 2 incorporates a gate-source power-source 30 connected to apply positive potential to gate 38 and negative potential to source 33. As shown in FIG. 3, a source-drain power-source 41 is arranged with its positive terminal connected to load resistor 43 to drain 34 and the negative terminal connected to ground 45 and to the sources 33.

Figure 4:
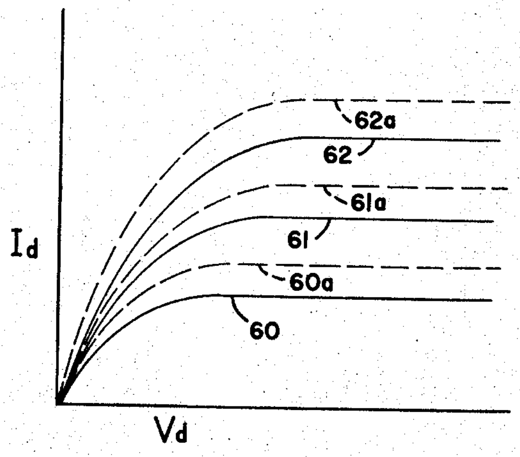
FIG. 4 is a current voltage diagram illustrating typical values of current voltage ratio when stress or strain is applied, in which the solid lines indicate the typical conditions when no stress or strain is applied and the broken lines indicate a typical condition with the application of stress or strain.

Stress or strain may be applied to the device as indicated in FIG. 2 by the application of force as indicated by arrow 50 at the center of slide or substrate 30 from the bottom side and applying downward force at the ends of top of slide 30 at the ends of arrows 51 and 52. Under the aforesaid conditions, the result of drain current shift due to variations in stress or strain is indicated in graph of FIG. 4 wherein the drain current is indicated by line I*d* and drain voltage is indicated along the horizontal component V*d*. The current values without the application of force at points 50, 51, and 52 is indicated by solid lines 60, 61, and 62 for different values of gate voltage. Broken lines 60A, 61A, and 62A indicate the current values under conditions of a constant force being applied at 50, 51, and 52 which correspond to the voltage applied at 60, 61, and 62 respectively. It can be seen, therefore, that variations of force to produce either stress or strain within slide 30 will cause a change in the drain current which is an analogue of the amount of force applied. The aforesaid, when calibrated, can be directly correlated with the quantum of stress or strain applied to the device, which therefore functions as a transducer.

It is noted that the device constructed in accordance with that shown in FIG. 2 will have an output impedance or resistance of approximately 100,000 ohms and therefore can be arranged to provide output to a relatively low resistance detector. The present device has an extremely fast response rate.

It is also noted that the device provides an output which provides a constant D.C. response and at the same time will respond above the kilocycle range so that the device is useful in both static and dynamic analysis of stress or strain.

Figure 5:
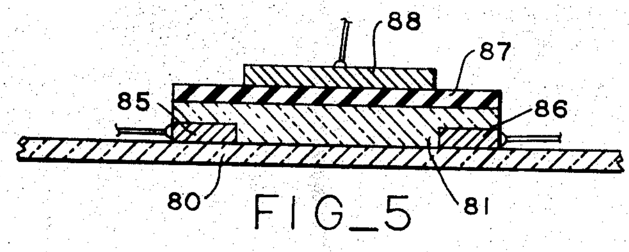
FIG. 5 is a cross-sectional view of still another embodiment of the transducer of the subject invention.

In order to obtain the results of the present invention, other configurations for the transducer can be utilized; for example, as shown in FIG. 5 the transducer can be formed on a substrate 80 similar to that shown at 30 in relation to FIG. 2 in which a piezoelectric body 81 is mounted on substrate 30. The source 85 and drain 86 are mounted on the bottom of piezoelectric body 81. The insulating coating 87 and gate electrode 88 are thence mounted on the top face of piezoelectric body 81.

It is further noted that other materials may be used to form the piezoelectric body in any of the possible configurations; for example, the piezoelectric body may be formed of cadmium selenide, or alternatively, may be formed of gallium arsenide. The base of substrate may be formed of any adequate insulating material, such as, glass, quartz, mica, or aluminum oxide.

As an additional variation of the device, the substrate as shown at 30 in FIG. 2 or 80 in FIG. 5 can be formed of a pliable insulating material such as Teflon or Mylar which would allow the greater flexibility in applications where a more flexible substrate is indicated.

While one embodiment of this invention has been shown and described, it will be apparent that other adaptations and modifications can be made without departing from the true spirit and scope of the invention.

What is claimed is:

1. A stress-strain transducer comprising an active element composed of a body of piezoelectric material having conductive source and drain electrodes at opposite ends thereof, an insulating coating over said source and drain and piezoelectric body, and a conductive gate electrode mounted on said insulating coating between said source and drain, means providing a gate voltage to said source and gate, means providing a drain voltage to said source and drain, current indicating means responding to current flow between said drain and said power source and means to apply stress-strain pressure to said active element whereby the current indicated by said current indicating means is an analogue of the quantum of stress-strain applied to said active element.

2. A stress-strain transducer comprising a flexible body, an active element composed of a thin film of piezoelectric material mounted on said flexible body, and having conductive source and drain electrodes at opposite ends of the piezoelectric material, and an insulating coating over said source and drain and piezoelectric material, and a conductive gate electrode mounted on said insulated coating between said source and drain power means providing a drain voltage to said source and drain and a gate voltage to said gate and source, current indicating means responsive to current flow between said source and drain and means to apply stress-strain to said flexible body whereby the current indicated by said current indicating means is an analogue of the quantum of stress-strain applied to said flexible body.

3. A stress-strain transducer according to claim 2 and wherein said piezoelectric material is formed of cadmium sulfide.

4. A stress-strain transducer according to claim 2 and wherein said piezoelectric material is formed of cadmium selenide.

5. A stress-strain transducer according to claim 2 and wherein said piezoelectric material is formed of gallium arsenide.

6. A stress-strain transducer according to claim 2 and wherein said flexible body is formed of a material having high insulating properties and being of sufficient flexibility to yield to the stress and strain to which the device is utilized without fracturing.

7. A stress-strain transducer comprising an active element composed of a body of piezoelectric material having conductive source and drain electrodes at opposite ends thereof, and insulated coating over said source and drain and piezoelectric body, and a conductive gate electrode mounted on said insulated coating between said source and drain, means providing a positive constant biasing voltage to said gate and a negative voltage to said source, means to provide a positive constant voltage to said drain and the negative to said source, current indicating means mounted between said source of constant voltage and said active element responsive to current flow through said active element and means to apply mechanical stress-strain to said active element whereby the current indicated by said current indicating means is an analogue of quantum of mechanical stress-strain applied to said active element.

References Cited

UNITED STATES PATENTS

| | | | |
|---|---|---|---|
| 3,021,441 | 2/1962 | Howatt | 310—8 |
| 3,031,591 | 4/1962 | Cary | 310—8.7 |
| 3,191,061 | 6/1965 | Weimer | 307—88.5 |
| 3,290,569 | 12/1966 | Weimer | 307—88.5 |
| 3,293,512 | 12/1966 | Simmons | 307—88.5 |
| 3,294,988 | 12/1966 | Packard | 310—8 |

MILTON O. HIRSHFIELD, *Primary Examiner*.

J. D. MILLER, *Examiner*.